(12) United States Patent
Nishiura

(10) Patent No.: US 8,081,465 B2
(45) Date of Patent: Dec. 20, 2011

(54) COOLING APPARATUS FOR SEMICONDUCTOR CHIPS

(75) Inventor: Akira Nishiura, Nagano (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 25 days.

(21) Appl. No.: 12/591,671

(22) Filed: Nov. 27, 2009

(65) Prior Publication Data
US 2010/0172091 A1 Jul. 8, 2010

(30) Foreign Application Priority Data

Nov. 28, 2008 (JP) .................................. 2008-304135

(51) Int. Cl.
*H05K 7/20* (2006.01)
(52) U.S. Cl. ....... 361/703; 165/80.3; 165/147; 165/185; 361/689; 361/690; 361/701; 361/707; 361/710; 257/713; 257/722
(58) Field of Classification Search .......................... None
See application file for complete search history.

(56) References Cited

U.S. PATENT DOCUMENTS

| | | | | |
|---|---|---|---|---|
| 4,103,737 A | * | 8/1978 | Perkins ....................... | 165/109.1 |
| 4,765,397 A | * | 8/1988 | Chrysler et al. ......... | 165/104.33 |
| 5,072,787 A | * | 12/1991 | Nakamichi ................. | 165/80.3 |
| 6,016,007 A | * | 1/2000 | Sanger et al. ................ | 257/714 |
| 6,373,705 B1 | * | 4/2002 | Koelle et al. ................ | 361/720 |
| 6,935,419 B2 | * | 8/2005 | Malone et al. ............... | 165/185 |
| 6,989,592 B2 | * | 1/2006 | Chang et al. ................. | 257/707 |
| 7,215,545 B1 | * | 5/2007 | Moghaddam et al. ........ | 361/699 |
| 7,272,015 B2 | * | 9/2007 | Karrer et al. ................. | 361/790 |
| 7,839,641 B2 | * | 11/2010 | Baba et al. ................... | 361/711 |
| 2007/0045801 A1 | * | 3/2007 | Sugiyama et al. ........... | 257/684 |
| 2010/0238629 A1 | * | 9/2010 | Shiba ........................... | 361/699 |
| 2010/0277868 A1 | * | 11/2010 | Beaupre et al. .............. | 361/700 |

FOREIGN PATENT DOCUMENTS

| | | |
|---|---|---|
| JP | H09-223883 | 8/1997 |
| JP | H09-283679 | 10/1997 |

* cited by examiner

*Primary Examiner* — Courtney Smith
(74) *Attorney, Agent, or Firm* — Manabu Kanesaka

(57) ABSTRACT

A cooling apparatus for semiconductor chips includes radiation fins formed on the opposite surface of metal base opposite to the surface of metal base, to which an insulator base board mounting semiconductor chips thereon, is disposed. The radiation fins, such as sheet-shaped fins having different lengths are arranged such that the surface area density of the fins becomes higher in the coolant flow direction, whereby the surface area density is the total surface area of radiation fins on a unit surface area of the metal base. As a result, the temperatures of semiconductor chips arranged along the coolant flow direction are closer to each other.

10 Claims, 10 Drawing Sheets

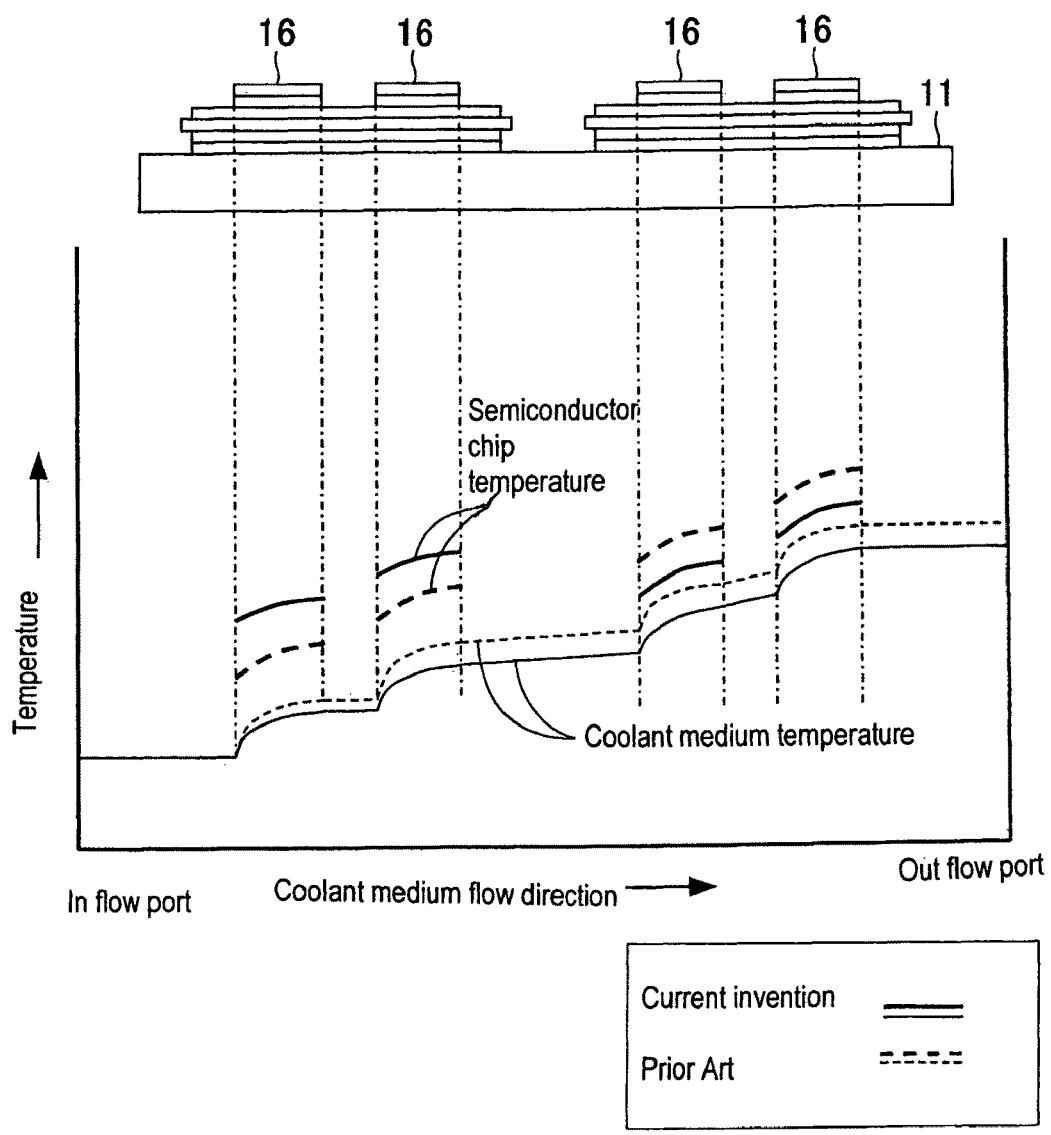

COOLING APPARATUS FOR SEMICONDUCTOR CHIPS

BACKGROUND OF THE INVENTION AND RELATED ART STATEMENT

The present invention relates to a cooling apparatus for semiconductor chips (hereinafter referred to simply as a "cooling apparatus"). More specifically, the invention relates to a cooling apparatus that includes an insulator base board on which semiconductor chips are arranged, a metal base on the front surface of which the insulator base board is bonded, radiation fins formed on the back surface of the metal base such that the radiation fins are integrated with the metal base to form a unit, and a duct cover that surrounds the radiation fins to cause a coolant flow between the radiation fins for removing the heat generated by the semiconductor chips.

Power semiconductor chips are used in the inverter circuit of a variable-speed motor-driving apparatus in an electric vehicle control system. Since the power semiconductor chips generate heat when a large current flows therethrough, the power semiconductor chips are used in combination with a cooling apparatus. In electric vehicle control systems, in which the weight of the cooling apparatus mountable and the space for mounting the cooling apparatus, are both limited, a liquid-cooling-type cooling apparatus that uses a circulating coolant is employed for improving the heat dissipation performance (cf. the following Patent Document 1).

In the cooling apparatus of a liquid-cooling type, thin sheet-shaped radiation fins are integrated with a metal base into a unit such that the thin sheet-shaped radiation fins are arranged uniformly in the duct, in which a coolant is caused to flow. An insulator base board, on which the semiconductor chips that generate heat are arranged, is bonded to the metal base. By causing a pressurized coolant to flow in the duct, the heat energy generated from the semiconductor chips is transferred efficiently to the coolant via the radiation fins having large surface areas. The coolant, the temperature of which is raised by the heat dissipated from the semiconductor chips, is cooled in an external heat exchanger. The coolant, after being cooled, is pressurized by a pump and returned to the duct in which the radiation fins are arranged.

[Patent Document 1] Japanese Unexamined Patent Application Publication No. Hei. 9 (1997)-283674

In the cooling apparatus as described above, the coolant temperature in the vicinity of a duct inlet port, to which the coolant cooled by the external heat exchanger is returned, is the lowest but rises as the coolant flows through the duct toward the outflow port. Accordingly, the temperature of the coolant that cools the semiconductor chips is continually elevated and is the highest in the vicinity of a duct outflow port. Therefore, in the cooling apparatus that arranges semiconductor chips along the flow direction of the coolant, the coolant temperature under the semiconductor chips becomes higher as the coolant flows downstream (as the semiconductor chip is positioned downstream on the coolant flow). Therefore, the semiconductor chip temperature becomes higher as the semiconductor chip in question is positioned downstream along the coolant flow.

If there exist temperature differences between the semiconductor chips, the output currents from the respective semiconductor chips are determined by the output current from the semiconductor chip, the temperature of which is the highest. Although the other semiconductor chips can make a larger output current flow, the output currents thereof are limited to the output current from the semiconductor chip, the temperature of which is the highest. Therefore, the other semiconductor chips tend to be undesirably limited in their output.

The temperature differences between the semiconductor chips may be eliminated by disposing many inflow ports and many outflow ports. However, the disposition of many inflow ports and outflow ports complicates the structure. To produce sufficient coolant flow it is necessary to pressurize the coolant to a high level.

In view of the foregoing, it is desirable to obviate the problems described above. It is also desirable to provide a cooling apparatus that facilitates the reduction of the temperature differences between the semiconductor chips using a simple structure.

SUMMARY OF THE INVENTION

According to the invention, there is provides a cooling apparatus for semiconductor chips, the cooling apparatus including:

a metal base having a first major surface and a second major surface;

an insulator base board bonded to the first major surface of the metal base, the insulator base board mounting the semiconductor chips thereon;

a plurality of radiation fins formed on the second major surface of the metal base, the radiation fins being integrated with the metal base into a unit; and a duct cover bonded to the metal base, the duct cover surrounding the radiation fins, and having an inflow port on the first end thereof and an outflow port on the second end thereof for directing a coolant flow between the radiation fins in one flow direction from the inflow port to the outflow port;

wherein the radiation fins are configured for causing the cooling efficiency thereof to increase in the flow direction of the coolant from the inflow port toward the outflow port.

With the cooling apparatus for semiconductor chips (hereinafter referred to simply as the "cooling apparatus") configured as described above, the cooling efficiency of the radiation fins is lower on the side of the inflow port and higher on the side of the outflow port. With this configuration, the temperature difference between the semiconductor chips and the coolant, is reduced toward the outflow port. That is to say, a chip temperature that is higher on the side of the outflow port, is attenuated or prevented.

Accordingly, since the temperature difference between the semiconductor chips arranged in the coolant flow direction is reduced, the working temperatures of all the semiconductor chips are caused to be close to each other.

By configuring the radiation fins such that the cooling efficiencies thereof are not equal to each other in the coolant flow direction, in the manner described above, the temperatures, at which the semiconductor chips output their respective maximum outputs, are rendered close to each other. Therefore, the derating due to the temperature unbalance is avoided and a larger chip output is enabled.

Since the objects of the invention are achieved simply by changing the configuration of the radiation fins, it is not necessary to employ complicated measures such as providing a plurality of inflow ports and a plurality of outflow ports. The manufacturing costs of the cooling apparatus according to the embodiments of invention, are therefore attenuated.

BRIEF DESCRIPTION OF THE DRAWINGS

FIG. 3 describes the temperature changes of the semiconductor chips and the coolant respectively caused in the cooling apparatus according to the first embodiment of the invention and in the conventional cooling apparatus.

DETAILED DESCRIPTION OF THE INVENTION

The invention will now be described in detail hereinafter with reference to the accompanied drawings which illustrate the preferred embodiments of the invention.

Figure 1A:
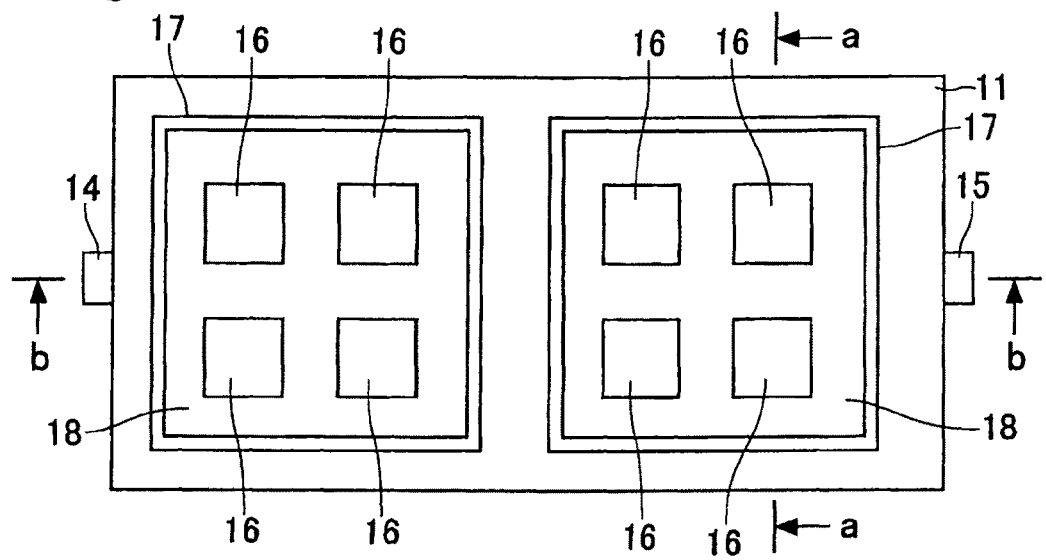
FIG. 1(A) is a top plan view of a cooling apparatus for semiconductor chips (hereinafter referred to as a "cooling apparatus") according to a first embodiment of the invention.
Figure 1B:
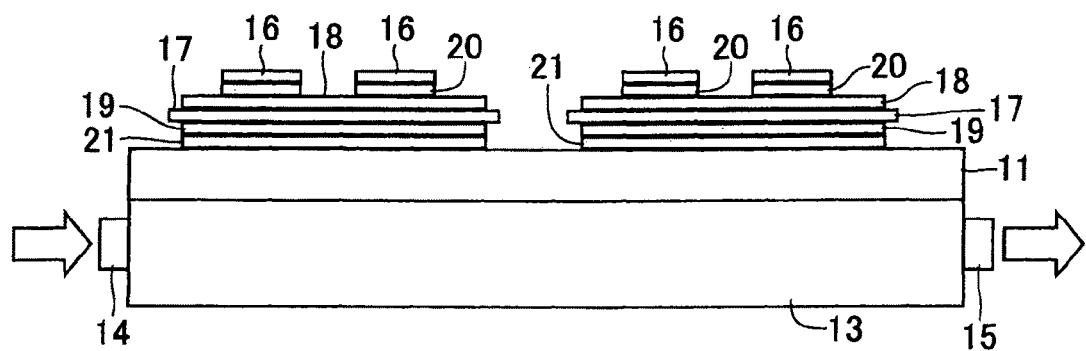
FIG. 1(B) is a side plan view of the cooling apparatus according to the first embodiment shown in FIG. 1(A).
Figure 1C:
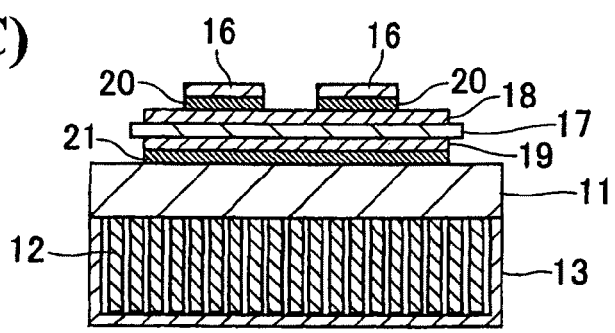
FIG. 1(C) is a cross sectional view of the cooling apparatus according to the first embodiment along section line a-a of FIG. 1(A).

FIG. 1(A) is a top plan view of a cooling apparatus for semiconductor chips (hereinafter referred to as a "cooling apparatus") according to a first embodiment of the invention. FIG. 1(B) is a side plan view of the cooling apparatus shown in FIG. 1(A); and FIG. 1(C) is a cross sectional view of the cooling apparatus along a-a of FIG. 1(A).

The electrical connections on the semiconductor chips, the terminals for external connections, the casing, and the sealant are not shown in these drawings.

The cooling apparatus according to the first embodiment of the invention includes metal base 11, on which heat sources are mounted, radiation fins 12 are formed on the under surface of metal base 11 and integrated with metal base 11 into a unit, and a duct cover 13 is bonded to metal base 11 such that duct cover 13 surrounds radiation fins 12 and forms a duct (flow path) for a coolant. The radiation fins 12 are made of a metal or an alloy such as copper, a copper alloy, aluminum, and an aluminum alloy. The duct cover 13 includes a inflow port 14 disposed upstream on the coolant flow path, and an outflow port 15 disposed downstream on the coolant flow path. An external heat exchanger is connected to the outflow port 15. The external heat exchanger is connected also to inflow port 14 via a pump. The pump forces the coolant to circulate between the outflow port and the inflow port. In the flow path of the coolant surrounded by duct cover 13, radiation fins 12 are arranged so that the cooling or heat exchange efficiency thereof becomes higher in the coolant flow direction (viz., from inflow port 14 to outflow port 15).

Insulator base board 17, on which semiconductor chips 16 are arranged, is mounted on the upper surface of metal base 11. The semiconductor chips 16 may comprise, merely by way of example, a power semiconductor device such as an insulated gate bipolar transistor (hereinafter referred to as an "IGBT") and/or a free wheeling diode. Insulator base board 17 is formed of a ceramic plate, on both major surfaces of which wirings 18 and 19 are bonded. The semiconductor chips 16 are bonded with solder 20 to wiring 18 on the upper surface of insulator base board 17. Wiring 19 on the lower surface of insulator base board 17 is bonded with solder 21 to metal base 11. The embodiment of the invention shown in FIG. 1(A) has, in this particular case, two semiconductor chip rows, each including four semiconductor chips 16 arranged in the coolant flow direction.

As the semiconductor chips 16 generates heat, the heat is transferred via insulator base board 17 and metal base 11 to radiation fins 12 directly under semiconductor chip 16. The heat from semiconductor chip 16 is cooled on radiation fins 12 by the heat exchange with the coolant pressurized and supplied into the inflow port 14. The cooling is affected in succession in the flow direction of the coolant at the positions corresponding to the respective semiconductor chips 16. The heated coolant is sent out from outflow port 15, cooled through the heat dissipation in the external heat exchanger, pressurized by the pump, and returned to inflow port 14.

Figure 2A:
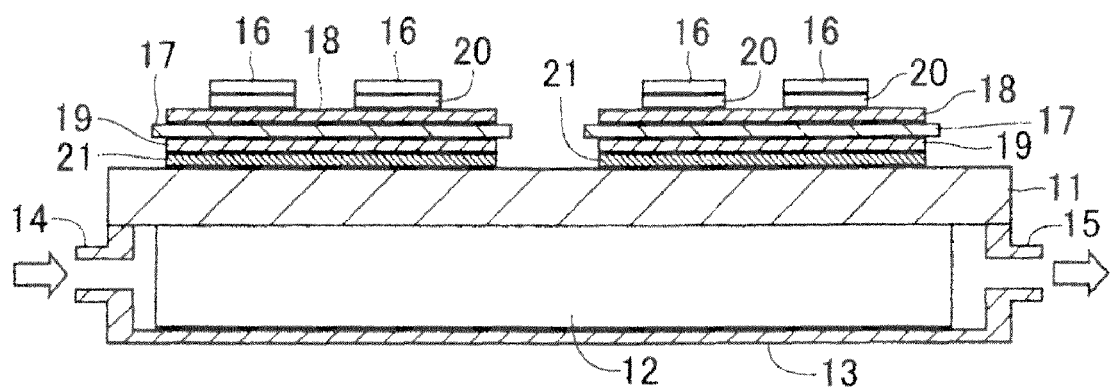
FIG. 2(A) is a cross sectional view of the cooling apparatus according to the first embodiment along section line b-b of FIG. 1(A).
Figure 2B:
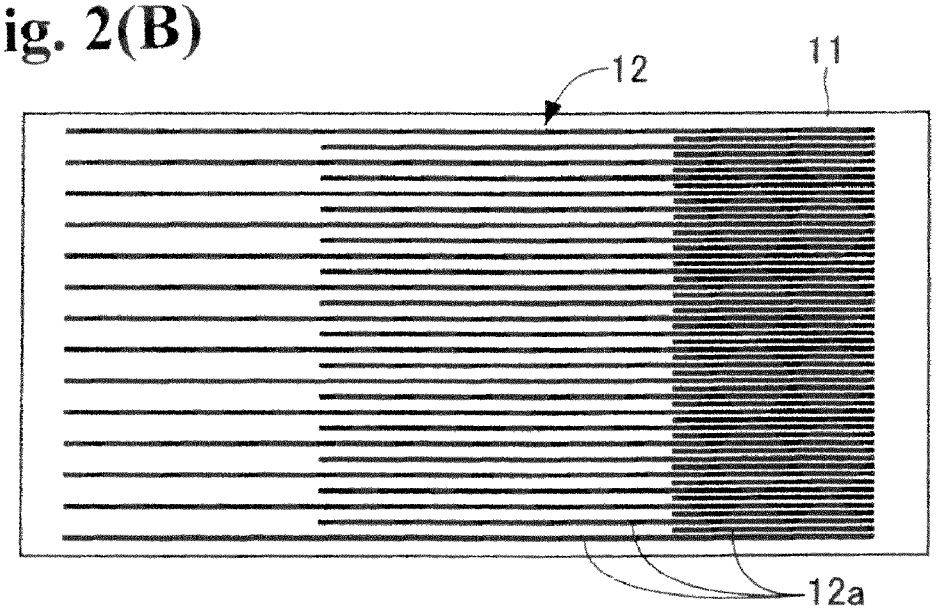
FIG. 2(B) is a top plan view showing the shapes and arrangements of the radiation fins in the cooling apparatus according to the first embodiment.

FIG. 2(A) is a cross sectional view of the cooling apparatus according to the first embodiment as taken along b-b of FIG. 1(A). FIG. 2(B) is a top plan view showing the shapes and arrangements of the radiation fins in the cooling apparatus according to the first embodiment.

In the cooling apparatus according to the first embodiment, radiation fins 12 are sheet-shaped fins 12*a* which extend along the coolant flow direction in the duct and bonding to metal base 11. The lengths of sheet-shaped fins 12*a* are adjusted appropriately such that the spacing between the adjacent fins 12*a* is reduced from the side of inflow port 14 to the side of outflow port 15. By the above-described configuration, the total surface area of sheet-shaped fins 12*a* on a unit surface area of metal base 11 (hereinafter referred to as the "surface area density of sheet-shaped fins 12*a*") is increased gradually and the cooling or heat exchange efficiency is increased from the inflow port 14 toward the outflow port 15.

FIG. 3 describes the temperature changes of the semiconductor chips and the coolant caused in both the conventional cooling apparatus and the cooling apparatus according to the first embodiment of the invention.

FIG. 3 compares the temperature changes of the semiconductor chips and the coolant caused in the conventional cooling apparatus, in which the surface area density of the radiation fins is uniform, and the cooling apparatus according to the first embodiment, in which the surface area density of radiation fin 12 is increased in the flow direction of the coolant. In the upper section of FIG. 3, the arrangement of semiconductor chips 16 along the coolant flow direction is described. In the lower section of FIG. 3, the temperature changes of semiconductor chips 16 at the respective locations in the coolant flow direction are described together with the average temperature changes of the coolant in the flow direction thereof.

When semiconductor chips 16 generate the same amount of heat, the temperature differences between semiconductor chips 16 and the coolant are almost the same. Therefore, the temperature of semiconductor chip 16 and the coolant temperature increases from inflow port 14 toward outflow port 15.

Since the radiation fins are arranged uniformly in the conventional cooling apparatus, the coolant temperature is lower on the side of inflow port 14 and the temperature of semiconductor chip 16 is also lower on the side of inflow port 14. Since the coolant temperature becomes higher toward outflow port 15, the temperature of semiconductor chip 16 becomes higher toward outflow port 15 by the difference between the coolant temperatures in question.

In the cooling apparatus according to the first embodiment, the surface area density of radiation fins 12 is higher on the side of outflow port 15 and lower on the side of inflow port 14 so that the cooling efficiency may be lower upstream in the coolant flow and higher downstream in the coolant flow. Therefore, the temperature of semiconductor chip 16 on the side of inflow port 14 is higher by the amount of heat not dissipated due to the lower cooling efficiency than the temperature of semiconductor chips 16 that generates the same amount of heat in the conventional cooling apparatus. The coolant temperature is prevented from rising upstream in the flow thereof due to the lower cooling efficiency upstream in the coolant flow.

The temperature difference between semiconductor chips 16 and the coolant is smaller due to the cooling efficiency of radiation fins 12 which is higher in the downstream coolant flow, and a higher coolant temperature caused in the upstream coolant flow due to a lower cooling efficiency.

By setting the cooling efficiencies of radiation fins 12 in an unbalanced manner, such that the cooling efficiency is lower on the side of inflow port 14 and higher on the side of outflow port 15, the temperature differences caused between semiconductor chips 16 arranged along the coolant flow direction are reduced and the temperatures of all the semiconductor chips 16 are caused to be close to each other. Since the highest temperature of semiconductor chips 16 is lowered by the measures described above, it is possible to cause all the semiconductor chips 16 to function under substantially the same temperature conditions and therefore induce the current outputs therefrom to be essentially the same. Therefore, it is not necessary to suppress the maximum output (viz., conduct derating) due to a temperature unbalance and it is possible to raise the rated output.

Figure 4A:
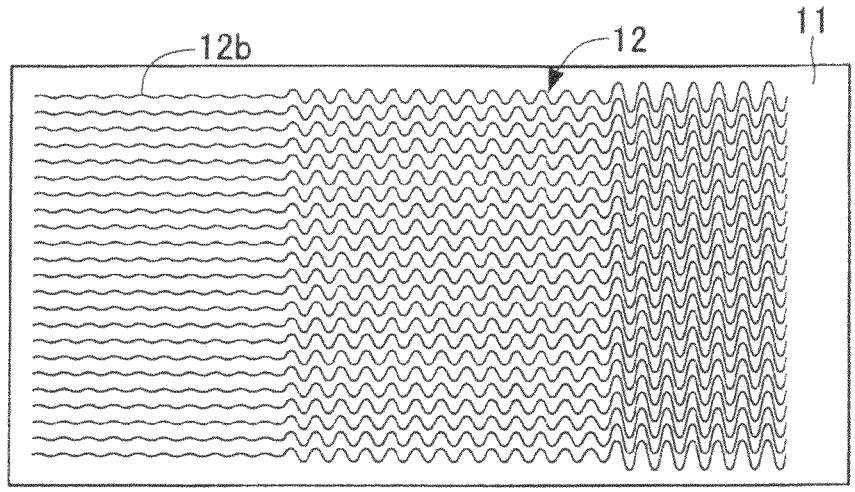
FIG. 4(A) is a top plan view showing a first example of modified radiation fins used in the cooling apparatus according to the first embodiment of the invention.
Figure 4B:
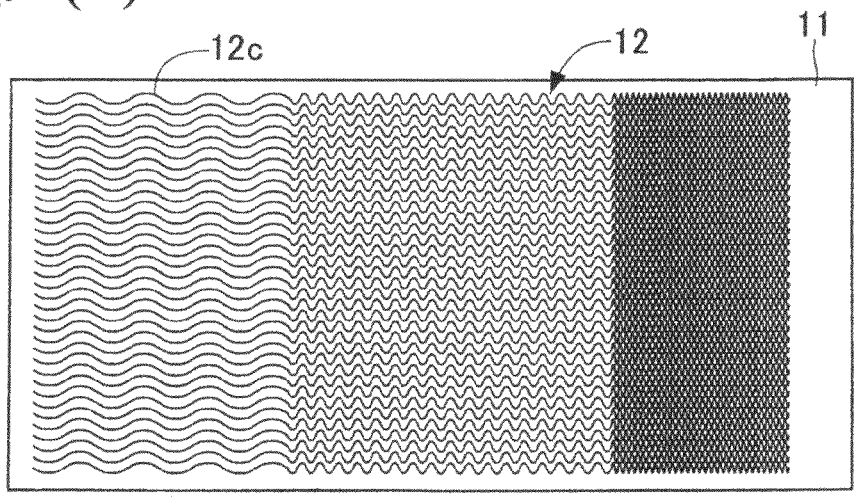
FIG. 4(B) is a top plan view showing a second example of modified radiation fins used in the cooling apparatus according to the first embodiment.
Figure 4C:
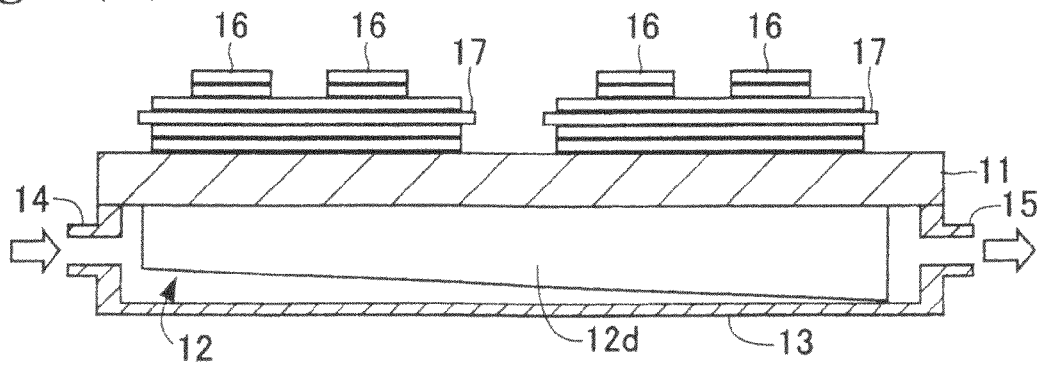
FIG. 4(C) is a cross sectional view of the cooling apparatus according to the first embodiment showing a third example of modified radiation fins.

FIG. 4(A) is a top plan view showing a first example of modified radiation fins in the cooling apparatus according to the first embodiment of the invention. FIG. 4(B) is a top plan view showing a second example of modified radiation fins in the cooling apparatus according to the first embodiment. FIG. 4(C) is a cross sectional view of the cooling apparatus according to the first embodiment showing a third example of modified radiation fins.

In the cooling apparatus shown in FIGS. 2(A) and 2(B), the extending lengths of sheet-shaped fins 12a, arranged more densely in the width direction of the duct on the side of outflow port 15, are adjusted appropriately. By adjusting the extending lengths of sheet-shaped fins 12a appropriately, the surface area density of sheet-shaped fins 12a is changed in the duct. The surface area density of sheet-shaped fins 12a can be changed by alternative configurations.

In the first example of modification shown in FIG. 4(A), radiation fin 12 is corrugated-sheet-shaped fin 12b extended along the coolant flow direction. The corrugation amplitude of corrugated-sheet-shaped fin 12b is made wider from the side of inflow port 14 to the side of outflow port 15. Due to the shape of corrugated-sheet-shaped fin 12b, the surface area density of corrugated-sheet-shaped fins 12b is raised gradually from inflow port 14 toward outflow port 15. In FIG. 4(A), the amplitude of corrugated-sheet-shaped fin 12b is changed in three steps or stages. Alternatively, the amplitude of corrugated-sheet-shaped fin 12b may be changed continuously. Still alternatively, the section of corrugated-sheet-shaped fin 12b not positioned right under semiconductor chip 16 may be straightened and the section of corrugated-sheet-shaped fin 12b positioned right under semiconductor chip 16 may be corrugated such that the amplitude of corrugation may be widened stepwisely.

In the second modification example shown in FIG. 4(B), radiation fins 12 are corrugated-sheet-shaped fin 12c extended along the coolant flow direction. The corrugated-sheet-shaped fins 12c has a given amplitude in the coolant flow direction. The pitch of corrugation in corrugated-sheet-shaped fins 12c is arranged to be shorter from inflow port 14 toward outflow port 15. Due to the shape of corrugated-sheet-shaped fin 12c, the surface area density of corrugated-sheet-shaped fins 12c is higher gradually from inflow port 14 toward outflow port 15.

In the third modification example shown in FIG. 4(C), the radiation fins 12 comprise radiation fins 12d that are any of sheet-shaped fins 12a, corrugated-sheet-shaped fins 12b, and corrugated-sheet-shaped fins 12c shown in FIGS. 2(B), 4(A), and 4(B). The radiation fins 12d of the third modification example are shaped such that the height thereof increases from inflow port 14 toward outflow port 15. Due to this shape of the fins 12d, the surface area density of fins 12d is caused to increase gradually from inflow port 14 toward outflow port 15.

Figure 5A:
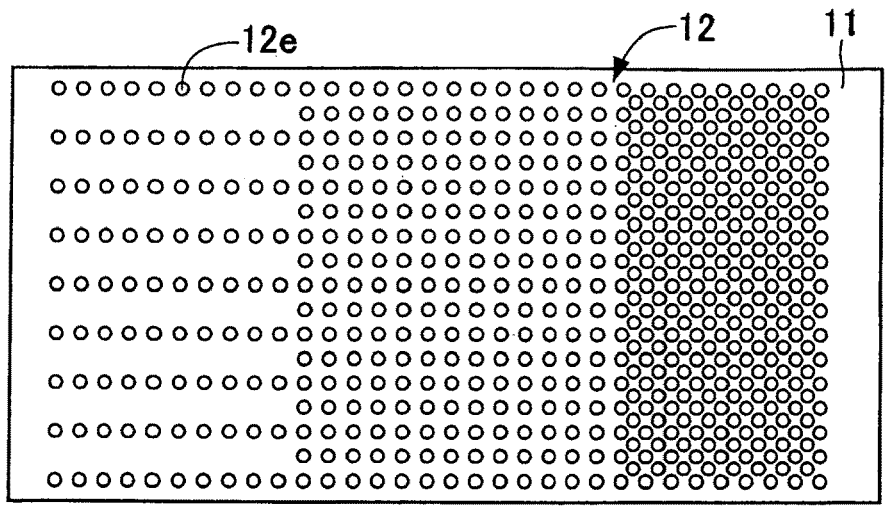
FIG. 5(A) is a top plan view showing the radiation fins used in a cooling apparatus according to a second embodiment of the invention.
Figure 5B:
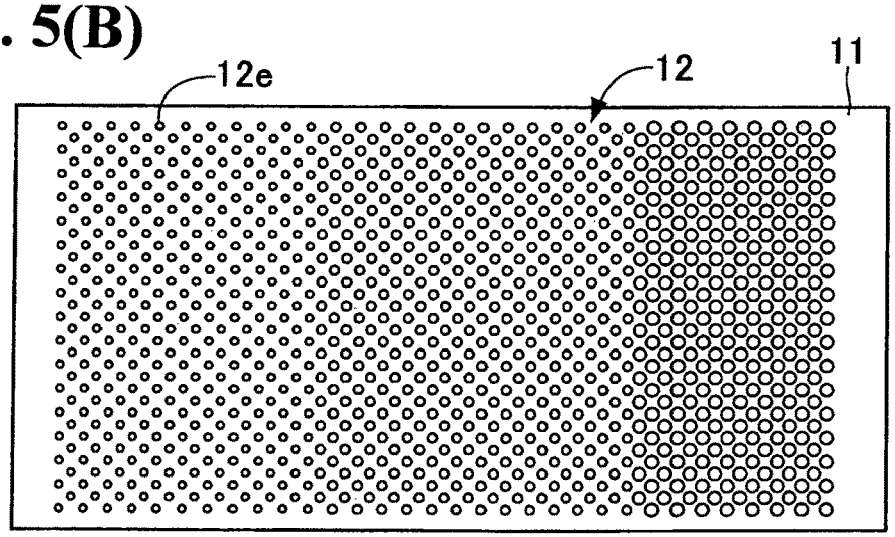
FIG. 5(B) is a top plan view showing a first example of modified radiation fins used in the cooling apparatus according to the second embodiment.
Figure 5C:
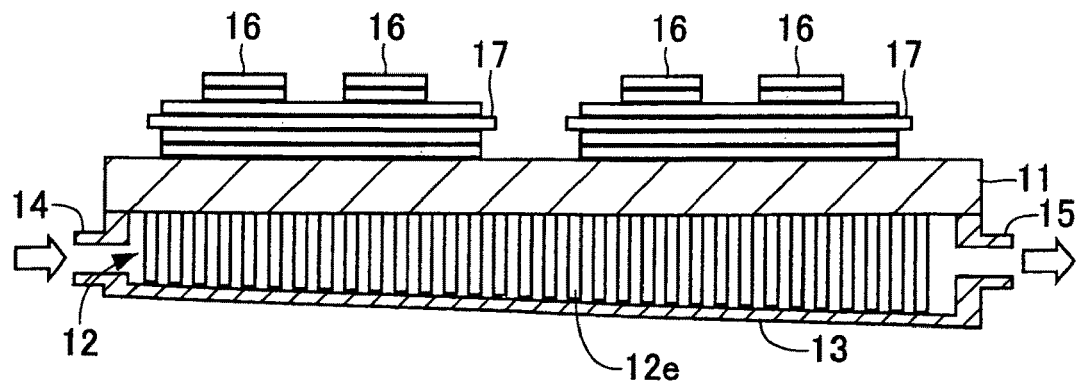
FIG. 5(C) is a cross sectional view of the cooling apparatus according to the second embodiment showing a third example of modified radiation fins.

FIG. 5(A) is a top plan view showing the radiation fins in a cooling apparatus according to a second embodiment of the invention. FIG. 5(B) is a top plan view showing a first example of modified radiation fins in the cooling apparatus according to the second embodiment. FIG. 5(C) is a cross sectional view of the cooling apparatus according to the second embodiment showing a second example of modified radiation fins.

In the cooling apparatus according to the second embodiment of the invention, radiation fins 12 are pin-shaped (viz., cylindrical) fins 12e arranged along the coolant flow direction in the duct and bonded/connected to metal base 11. In FIG. 5(A), pin-shaped fins 12e having the same diameter and the same height are arranged such that the pitch between the adjacent pin-shaped fins 12e is made shorter from inflow port 14 toward outflow port 15. Due to the fin arrangement described above, the total surface area of pin-shaped fins 12e on a unit area of metal base 11 (hereinafter referred to as the "surface area density of pin-shaped fins 12e") is gradually higher from inflow port 14 toward outflow port 15.

The radiation fins in the cooling apparatus shown in FIG. 5(B) comprise a first modified example of radiation fin 12 shown in FIG. 5(A). In FIG. 5(B), radiation fins 12 are pin-shaped fins 12e having the same height and arranged at the same pitch in a section of the duct. The diameter of pin-shaped fins 12e in the section of the duct on the side of outflow port 15 is larger than the diameter of pin-shaped fins 12e in the section of the duct on the side of inflow port 14. Therefore, the surface area density of pin-shaped fins 12e becomes higher gradually from inflow port 14 toward outflow port 15.

The radiation fin in the cooling apparatus shown in FIG. 5(C) is a modified example of radiation fins 12 shown in FIGS. 5(A) and 5(B). In FIG. 5(C), the radiation fins 12 are pin-shaped fins 12e having the same diameter as shown in FIG. 5(A) or having different diameters as shown in FIG. 5(B). However, the height of pin-shaped fins 12e becomes higher gradually from inflow port 14 toward outflow port 15. The cooling apparatus having the structure described above facilitates improving the cooling efficiency of radiation fins 12, made to be higher from inflow port 14 toward outflow port 15, such that the cooling efficiency of radiation fins 12 becomes further higher gradually from inflow port 14 toward outflow port 15. In FIG. 5(C), the clearance between pin-shaped fins 12e and duct cover 13 is set to be constant along the coolant flow direction.

Figure 6:
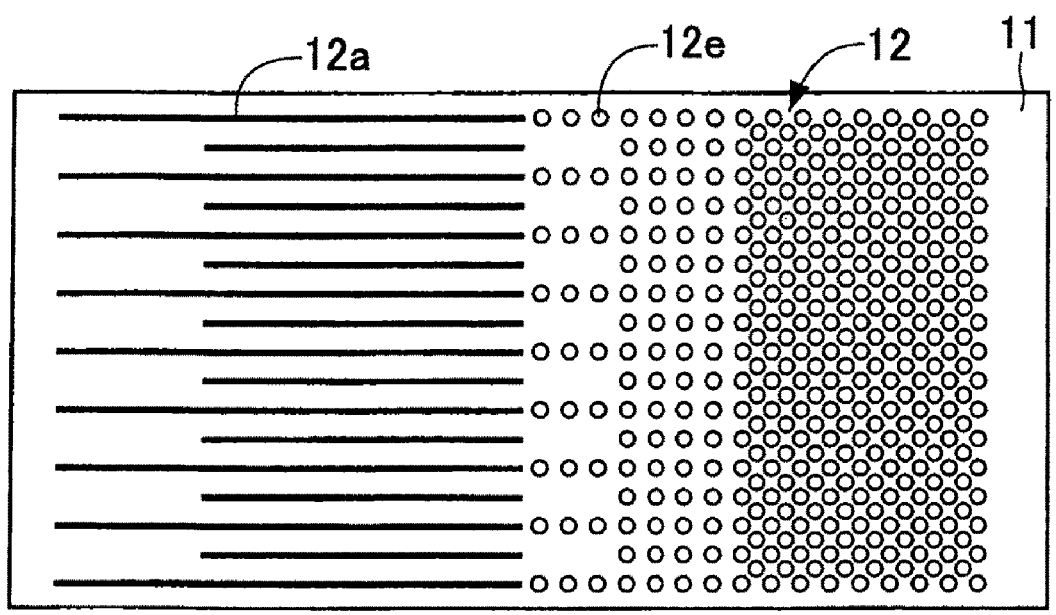
FIG. 6 is a top plan view showing the radiation fins used in a cooling apparatus according to a third embodiment of the invention.

FIG. 6 is a top plan view showing the radiation fins in a cooling apparatus according to a third embodiment of the invention.

In the cooling apparatus according to this third embodiment, radiation fins 12 include sheet-shaped fins 12a shown in FIG. 2(B), and pin-shaped fins 12e shown in FIG. 5(A). By combining and arranging fins 12a and 12e as described in FIG. 6, the surface area density of radiation fins 12 is made to be higher gradually from inflow port 14 toward outflow port 15.

Alternatively, sheet-shaped fins 12a shown in FIG. 6 may be replaced by corrugated-sheet-shaped fins 12b or 12c shown in FIG. 4(B) or 4(C) without difficulty. Still alternatively, pin-shaped fins 12e shown in FIG. 6 may be replaced by fins 12e having different diameters as shown in FIG. 5(B) and arranged as shown in FIG. 5(B) without difficulty. Moreover, the heights of corrugated-sheet-shaped fins 12b, 12c and/or the height of pin-shaped fin 12e may be changed without difficulty such that sheet-shaped fins 12b, 12c and/or pin-shaped fin 12e becomes higher gradually from inflow port 14 toward outflow port 15.

Figure 7A:
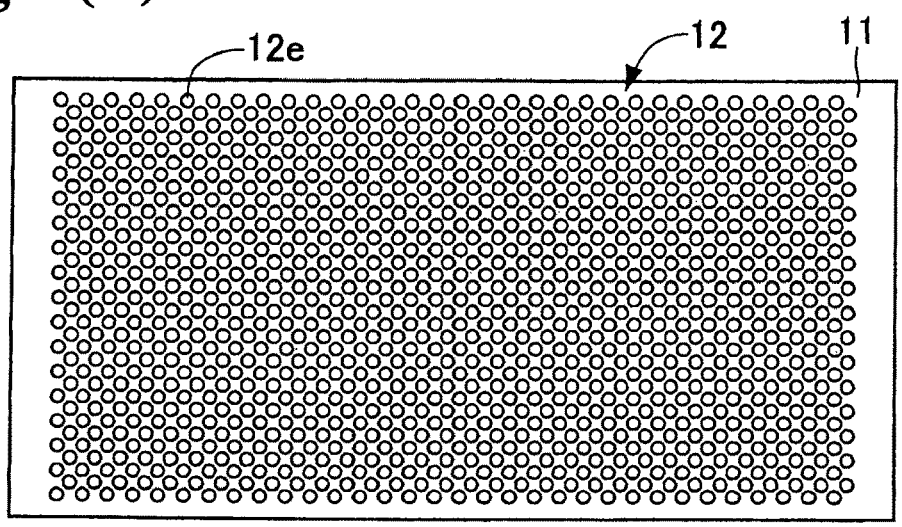
FIG. 7(A) is a top plan view showing the radiation fins used in a cooling apparatus according to a fourth embodiment of the invention.
Figure 7B:
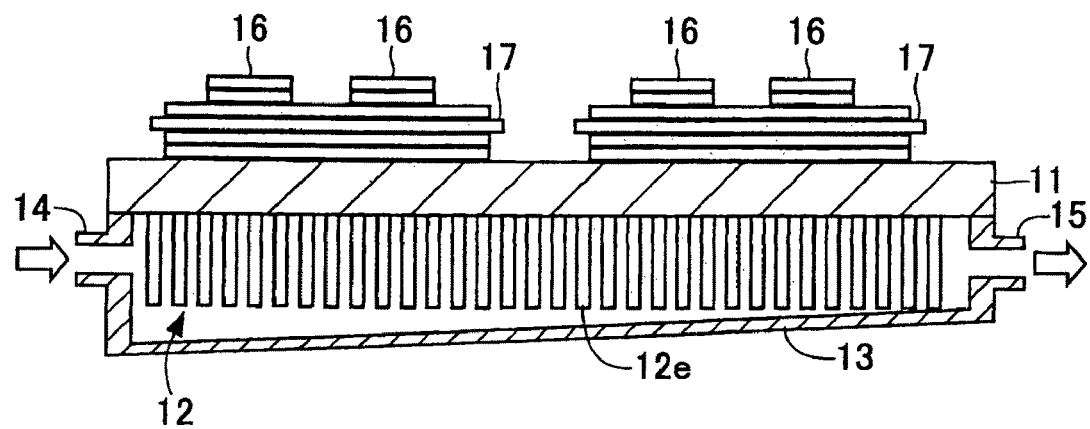
FIG. 7(B) is a cross sectional view of the cooling apparatus according to the fourth embodiment.

FIG. 7(A) is a top plan view showing the radiation fins in a cooling apparatus according to a fourth embodiment of the invention. FIG. 7(B) is a cross sectional view of the cooling apparatus according to the fourth embodiment.

The cooling apparatus according to this fourth embodiment includes radiation fins 12, arranged uniformly in a duct and formed of pin-shaped fins 12e having the same diameter and the same height. The duct cover 13, however, is formed such that the clearance between the duct cover 13 and the tips of pin-shaped fins 12e is wider on the side of inflow port 14 and narrower on the side of outflow port 15. In other words, the flow path cross sectional area is wider on the side of inflow port 14 and narrower on the side of outflow port 15.

In the section of the duct on the side of inflow port 14, in which the clearance between duct cover 13 and the tips of pin-shaped fins 12e is wide, the coolant flows mainly through the clearance in that the resistance thereof is low. On the other hand, the flow rate of the coolant that flows through the path between pin-shaped fins 12e, wherein the resistance thereof is high, is low. Therefore, the cooling efficiency is low on the side of inflow port 14. On the contrary, in the section of the duct on the side of outflow port 15, in which there remains no clearance between the duct cover 13 and the tips of pin-shaped fins 12e, the coolant flow path is pinched and the coolant is forced to flow through the path between pin-shaped fins 12e. As a result, the resistance thereof is very high, at a high flow rate. Therefore, the cooling efficiency is very high on the side of outflow port 15.

By setting the flow rate of the coolant made to flow between pin-shaped fins 12e to be low on the side of inflow port 14 and to be high on the side of outflow port 15, the cooling efficiency of radiation fins 12 is made to be higher from inflow port 14 toward outflow port 15. By the schemes described above, the temperatures of semiconductor chips 16 arranged along the coolant flow direction are caused to be close to each other.

Figure 8A:
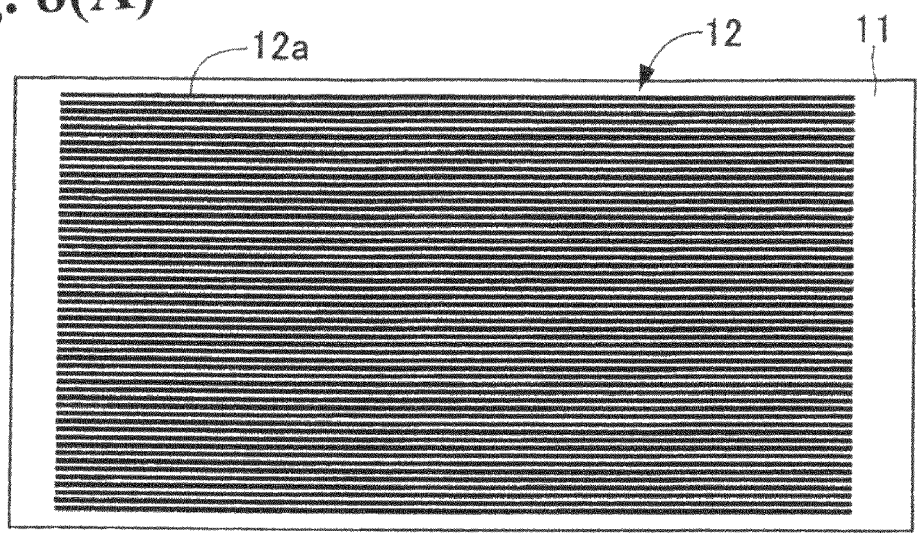
FIG. 8(A) is a top plan view showing radiation fins used in a modified cooling apparatus according to the fourth embodiment of the invention.
Figure 8B:
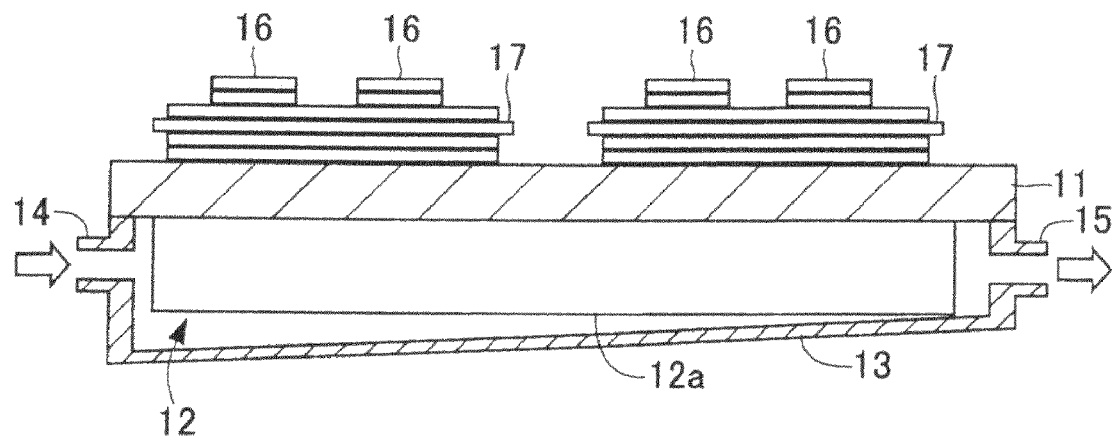
FIG. 8(B) is a cross sectional view of a cooling apparatus according to the fourth embodiment.

FIG. 8(A) is a top plan view showing the other radiation fins in a modified cooling apparatus according to the fourth embodiment of the invention. FIG. 8(B) is a cross sectional view of the modified cooling apparatus according to the fourth embodiment.

In FIGS. 8(A) and 8(B), the radiation fins 12 comprise sheet-shaped fins 12a having the same length and the same height, and are arranged uniformly in the width direction of the duct (viz., perpendicular to the coolant flow path). In the configuration depicted in FIGS. 8(A) and 8(B), the duct cover 13 is formed such that the clearance between the sides of the sheet-shaped fins 12a on the opposite side of metal base 11 and duct cover 13, is wider on the side of the inflow port 14 and such that essentially no clearance is left on the side of the outflow port 15. By setting the flow rate of the coolant that flows between the sheet-shaped fins 12a to become higher as the flow flows from inflow port 14 toward outflow port 15, the cooling efficiency is increased in the coolant flow direction.

Figure 9A:
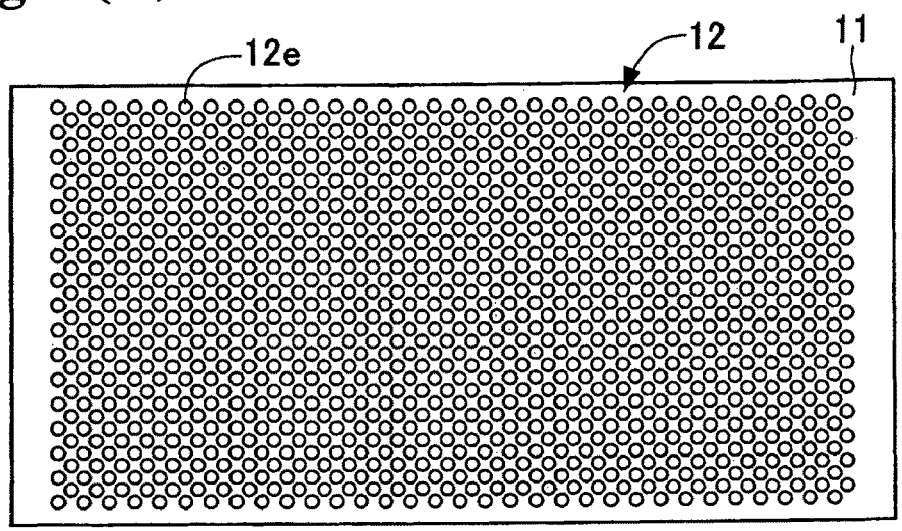
FIG. 9(A) is a top plan view showing the radiation fins used in a cooling apparatus according to a fifth embodiment of the invention.
Figure 9B:
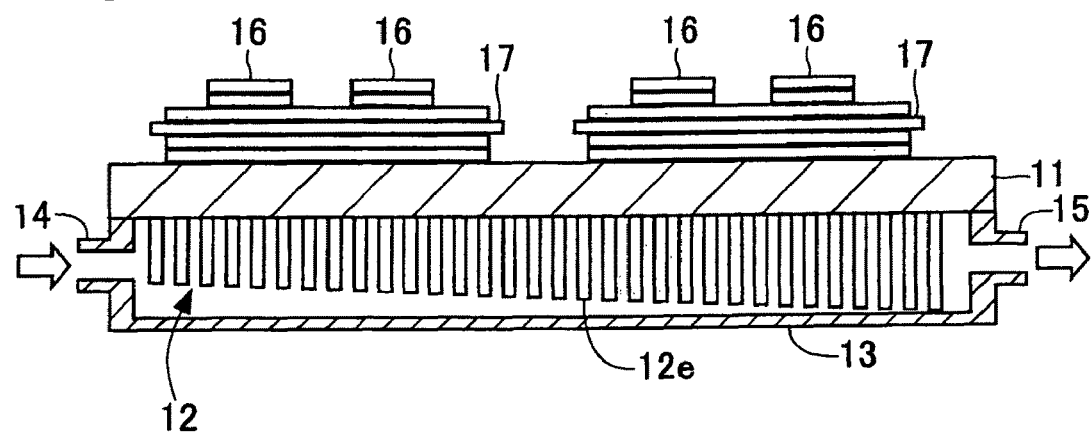
FIG. 9(B) is a cross sectional view of the cooling apparatus according to the fifth embodiment.

FIG. 9(A) is a top plan view showing the radiation fins in a cooling apparatus according to a fifth embodiment of the invention. FIG. 9(B) is a cross sectional view of the cooling apparatus according to this fifth embodiment.

In the configuration described in FIGS. 9(A) and 9(B), duct cover 13 is formed such that the cross sectional area of the flow path is constant between inflow port 14 and outflow port 15. Radiation fins 12 are formed of pin-shaped fins 12e and are arranged uniformly in the coolant flow direction and in the width direction of the duct. The pin-shaped fins 12e become higher (viz., longer) gradually from inflow port 14 toward outflow port 15. Therefore, the clearance between duct cover 13 and the tips of the pin-shaped fins 12e becomes narrower gradually from inflow port 14 toward outflow port 15.

By arranging the pin-shaped fins 12e uniformly on metal base 11 such that the pin-shaped fins 12e become longer gradually from inflow port 14 toward outflow port 15, the surface area density of radiation fins 12 in duct cover 13 becomes gradually higher downstream and, therefore, the cooling efficiency becomes gradually higher downstream. By the configuration described above, the cooling efficiency of radiation fins 12 becomes higher gradually from inflow port 14 toward outflow port 15. Therefore, the temperatures of semiconductor chips 16 arranged in the coolant flow direction are made uniform.

Figure 10A:
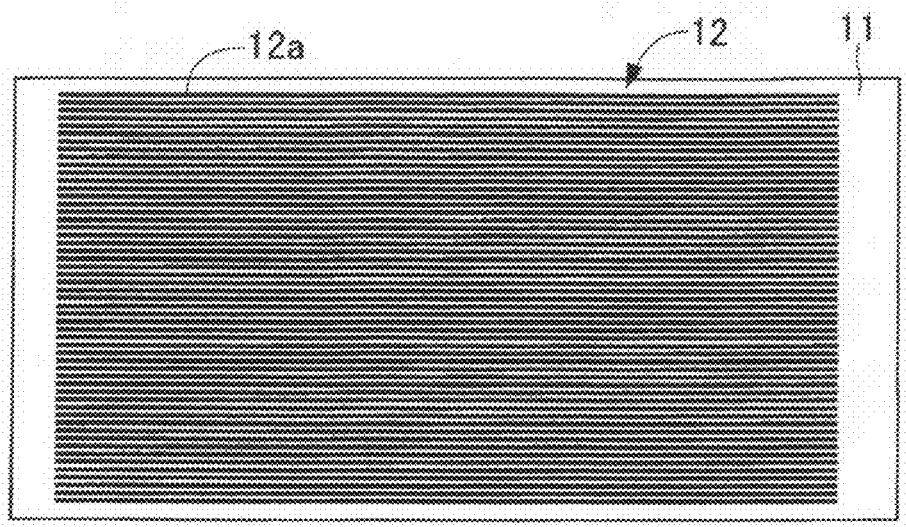
FIG. 10(A) is a top plan view showing the radiation fins used in a cooling apparatus according to the fifth embodiment of the invention.
Figure 10B:
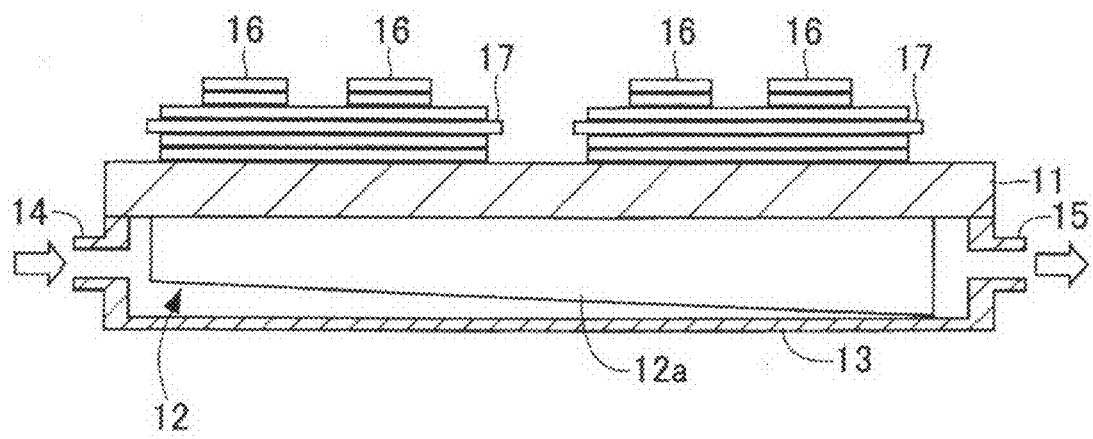
FIG. 10(B) is a cross sectional view of the cooling apparatus according to the fifth embodiment.

FIG. 10(A) is a top plan view showing radiation fins as used in a modified cooling apparatus according to the fifth embodiment of the invention. FIG. 10(B) is a cross sectional view of the modified cooling apparatus according to this fifth embodiment.

In FIGS. 10(A) and 10(B), radiation fins 12 are formed of sheet-shaped fins 12a arranged uniformly in the width direction of the duct (in perpendicular to the coolant flow path). These sheet-shaped fins 12a have the same length. However, sheet-shaped fins 12a become higher gradually in the coolant flow direction. In the configuration described above, the clearance between duct cover 13 and the sides of sheet-shaped fins 12a on the side of duct cover 13 becomes narrower gradually from inflow port 14 toward outflow port 15.

By forming sheet-shaped fins 12a in duct cover 13, having a constant cross sectional area for the flow path in the coolant flow direction, such that sheet-shaped fins 12a becomes higher gradually from inflow port 14 toward outflow port 15, the surface area density of sheet-shaped fins 12a in duct cover 13 becomes gradually higher downstream and, therefore, the cooling efficiency becomes gradually higher downstream.

The disclosure of Japanese Patent Application No. 2008-304135 filed on Nov. 28, 2008 is incorporated herein.

While the invention has been explained with reference to the specific embodiments of the invention, the explanation is illustrative and the invention is limited only by the appended claims.

What is claimed is:

1. A cooling apparatus for semiconductor chips, comprising:
   a metal base comprising a first major surface and a second major surface;
   an insulator base board bonded to the first major surface of the metal base, the insulator base board mounting the semiconductor chips thereon;
   a plurality of radiation fins formed on the second major surface of the metal base, the radiation fins being integrated with the metal base into a unit; and
   a duct cover disposed on the metal base to define a duct, the duct cover surrounding the radiation fins, the duct cover comprising an inflow port on a first end thereof and an outflow port on a second end thereof for causing a coolant flow between the radiation fins in one flow direction from the inflow port to the outflow port;
   wherein the radiation fins is configured for increasing a cooling efficiency thereof in the flow direction of the coolant from the inflow port toward the outflow port;
   the radiation fins comprise sheet-shaped fins or pin-shaped fins extended along the duct in a flow direction of the coolant respectively arranged in a duct, and
   a surface area density of the radiation fins is higher gradually from the inflow port toward the outflow port, and the surface area density of the radiation fins is a total surface area of the radiation fins on a unit surface area of the metal base.

2. The cooling apparatus according to claim 1, wherein an extending length of the sheet-shaped fin is adjusted such that a spacing between the adjacent sheet-shaped fins is shorter from the inflow port toward the outflow port for increasing the surface area density of the sheet-shaped fins from the inflow port toward the outflow port.

3. The cooling apparatus according to claim 1, wherein the sheet-shaped fin comprises a corrugated-sheet-shaped fin extended along the duct in the flow direction of the coolant, and the corrugated-sheet-shaped fin is formed such that an amplitude of corrugation thereof is larger from the inflow port toward the outflow port for increasing the surface area density of the sheet-shaped fins from the inflow port toward the outflow port.

4. The cooling apparatus according to claim 1, wherein the sheet-shaped fins comprise corrugated-sheet-shaped fins extended along the duct in the flow direction of the coolant, and the corrugated-sheet-shaped fin is formed such that the corrugation pitch thereof is shorter from the inflow port toward the outflow port for increasing the surface area density of the sheet-shaped fins from the inflow port toward the outflow port.

5. The cooling apparatus according to claim 2, wherein the sheet-shaped fins are formed such that the sheet-shaped fins become higher from the inflow port toward the outflow port for increasing the surface area density of the sheet-shaped fins from the inflow port toward the outflow port.

6. The cooling apparatus according to claim 1, wherein the pin-shaped fins have a common diameter and a common height, and the pin-shaped fins are arranged such that a spacing between the adjacent pin-shaped fins is shorter from the inflow port toward the outflow port for increasing the surface area density of the pin-shaped fins from the inflow port toward the outflow port.

7. The cooling apparatus according to claim 1, wherein the pin-shaped fins have a common height and are arranged at a common pitch, and a diameter of the pin-shaped fins is larger from the inflow port toward the outflow port for increasing the surface area density of the pin-shaped radiation fins from the inflow port toward the outflow port.

8. The cooling apparatus according to claim 1, wherein the pin-shaped fins have a common diameter, the pin-shaped fins are arranged such that a spacing between the adjacent pin-shaped fins is shorter from the inflow port toward the outflow port, and the pin-shaped fins are longer from the inflow port toward the outflow port for increasing the surface area density of the pin-shaped fins from the inflow port toward the outflow port.

9. The cooling apparatus according to claim 1, wherein the pin-shaped fins are arranged at a common pitch, a diameter of the pin-shaped fin is larger from the inflow port toward the outflow port, and the pin-shaped fins are longer from the inflow port toward the outflow port for increasing the surface area density of the pin-shaped fins from the inflow port toward the outflow port.

10. The cooling apparatus according to claim 1, wherein the radiation fins are made of a material selected from the group consisting of copper, a copper alloy, aluminum, and an aluminum alloy.

* * * * *

UNITED STATES PATENT AND TRADEMARK OFFICE
CERTIFICATE OF CORRECTION

| | |
|---|---|
| PATENT NO. | : 8,081,465 B2 |
| APPLICATION NO. | : 12/591671 |
| DATED | : December 20, 2011 |
| INVENTOR(S) | : Akira Nishimura et al. |

It is certified that error appears in the above-identified patent and that said Letters Patent is hereby corrected as shown below:

Please change column 6, line 55, "across" to --a cross--.

Signed and Sealed this
Nineteenth Day of June, 2012

David J. Kappos
*Director of the United States Patent and Trademark Office*